US012685025B2

(12) United States Patent
Kuo et al.

(10) Patent No.: US 12,685,025 B2
(45) Date of Patent: Jul. 14, 2026

(54) MANUFACTURING METHOD OF MEMORY DEVICE

(71) Applicant: UNITED MICROELECTRONICS CORP., Hsin-Chu City (TW)

(72) Inventors: Chih-Wei Kuo, Tainan City (TW); Chung-Yi Chiu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 235 days.

(21) Appl. No.: 18/376,840

(22) Filed: Oct. 5, 2023

(65) Prior Publication Data

US 2024/0032434 A1     Jan. 25, 2024

Related U.S. Application Data

(63) Continuation of application No. 17/377,367, filed on Jul. 15, 2021, now Pat. No. 11,825,751.

(30) Foreign Application Priority Data

Jun. 22, 2021    (CN) .......................... 202110690213.1

(51) Int. Cl.
  *H10N 50/01*        (2023.01)
  *H10B 61/00*        (2023.01)
  *H10N 50/80*        (2023.01)

(52) U.S. Cl.
  CPC ............. *H10N 50/01* (2023.02); *H10B 61/00* (2023.02); *H10N 50/80* (2023.02)

(58) Field of Classification Search
  None
  See application file for complete search history.

(56) References Cited

U.S. PATENT DOCUMENTS 5,641,712 A *  6/1997  Grivna ................ H01L 23/5222
                                                   438/626
8,822,303 B2   9/2014  Chen
(Continued)

FOREIGN PATENT DOCUMENTS

CN        1239827 A     12/1999
CN        106298831 A    1/2017
(Continued)

*Primary Examiner* — Yara B Green
*Assistant Examiner* — Fakeha Sehar
(74) *Attorney, Agent, or Firm* — Winston Hsu

(57) ABSTRACT

A manufacturing method of a memory device includes following steps. Memory units are formed on a substrate. Each memory unit includes a first electrode, a second electrode disposed above the first electrode in a vertical direction, and a memory material layer disposed between the first electrode and the second electrode. A conformal spacer layer is formed on the memory units. A non-conformal spacer layer is formed on the conformal spacer layer. A first opening is formed penetrating through a first portion of the non-conformal spacer layer between the memory units in a horizontal direction and a first portion of the conformal spacer layer on the first portion of the conformal spacer layer in the vertical direction. A thickness of a second portion of the non-conformal spacer layer on the second electrode is greater than a thickness of the second portion of the non-conformal spacer layer on the memory material layer.

14 Claims, 10 Drawing Sheets

(56)     References Cited

U.S. PATENT DOCUMENTS

| | | | |
|---|---|---|---|
| 9,564,577 B1 * | 2/2017 | Hsu | H10N 50/10 |
| 10,580,968 B1 | 3/2020 | Yi | |
| 11,121,135 B1 | 9/2021 | Ikeda | |
| 2015/0249204 A1 * | 9/2015 | Ha | H10B 61/22 |
| | | | 257/421 |
| 2016/0380183 A1 | 12/2016 | Chuang | |
| 2018/0151375 A1 | 5/2018 | Hsu | |
| 2019/0036014 A1 | 1/2019 | Ha | |
| 2019/0088863 A1 * | 3/2019 | Lu | H10N 70/826 |
| 2019/0157139 A1 * | 5/2019 | Cheng | H01L 23/53295 |
| 2019/0165260 A1 * | 5/2019 | Yu | G11C 11/161 |
| 2020/0006638 A1 | 1/2020 | Chen | |

FOREIGN PATENT DOCUMENTS

| | | |
|---|---|---|
| CN | 109860386 A | 6/2019 |
| CN | 110010759 A | 7/2019 |
| CN | 111696989 A | 9/2020 |
| TW | 201933601 A | 8/2019 |
| TW | 202103258 A | 1/2021 |

* cited by examiner

MANUFACTURING METHOD OF MEMORY DEVICE

CROSS REFERENCE TO RELATED APPLICATIONS

This application is a continuation application of U.S. application Ser. No. 17/377,367, filed on Jul. 15, 2021. The content of the application is incorporated herein by reference.

BACKGROUND OF THE INVENTION

1. Field of the Invention

The present invention relates to a manufacturing method of a memory device, and more particularly, to a manufacturing method of a memory device including a spacer layer.

2. Description of the Prior Art

Semiconductor memory devices are used in computer and electronics industries as a means for retaining digital information or data. Typically, the semiconductor memory devices are divided into volatile and non-volatile memory devices. The volatile memory device is a computer memory that loses its stored data when power to the operation is interrupted. Comparatively, in the non-volatile memory device, the stored data will not be lost when the power supply is interrupted. For example, magnetic random access memory (MRAM) is a kind of non-volatile memory technology. Unlike current industry-standard memory devices, MRAM uses magnetism instead of electrical charges to store data. In general, MRAM cells include a data layer and a reference layer. The data layer is composed of a magnetic material and the magnetization of the data layer can be switched between two opposing states by an applied magnetic field for storing binary information. The reference layer can be composed of a magnetic material in which the magnetization is pinned so that the strength of the magnetic field applied to the data layer and partially penetrating the reference layer is insufficient for switching the magnetization in the reference layer. During the read operation, the resistance of the MRAM cell is different when the magnetization alignments of the data layer and the reference layer are the same or not, and the magnetization polarity of the data layer can be identified accordingly.

SUMMARY OF THE INVENTION

A manufacturing method of a memory device is provided in the present invention. A conformal spacer layer is formed on memory units, and a non-conformal spacer layer is formed on the conformal spacer layer for protecting the memory unit in subsequent processes and improving manufacturing yield of the memory device accordingly.

According to an embodiment of the present invention, a manufacturing method of a memory device is provided. The manufacturing method includes the following steps. A plurality of memory units are formed on a substrate, and each of the memory units includes a first electrode, a second electrode, and a memory material layer. The second electrode is disposed above the first electrode in a vertical direction, and the memory material layer is disposed between the first electrode and the second electrode in the vertical direction. A conformal spacer layer is formed on the memory units, and a non-conformal spacer layer is formed on the conformal spacer layer. The conformal spacer layer comprises a first portion and a second portion. The first portion of the conformal spacer layer is located between the memory units adjacent to each other in a horizontal direction, and the second portion of the conformal spacer layer is located on a sidewall of the second electrode of each of the memory units. The non-conformal spacer layer comprises a first portion and a second portion. The first portion of the non-conformal spacer layer is located on the first portion of the conformal spacer layer, and the second portion of the non-conformal is located on the second portion of the conformal spacer layer in the horizontal direction. A first opening is formed subsequently. The first opening penetrates through the first portion of the non-conformal spacer layer and the first portion of the conformal spacer layer in the vertical direction. The second portion of the non-conformal spacer layer is formed on the second electrode of each of the memory units and the memory material layer of each of the memory units in the horizontal direction, and a thickness of the second portion of the non-conformal spacer layer on each of the second electrodes in the horizontal direction is greater than a thickness of the second portion of the non-conformal spacer layer on each of the memory material layers in the horizontal direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a manufacturing method of a memory device according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
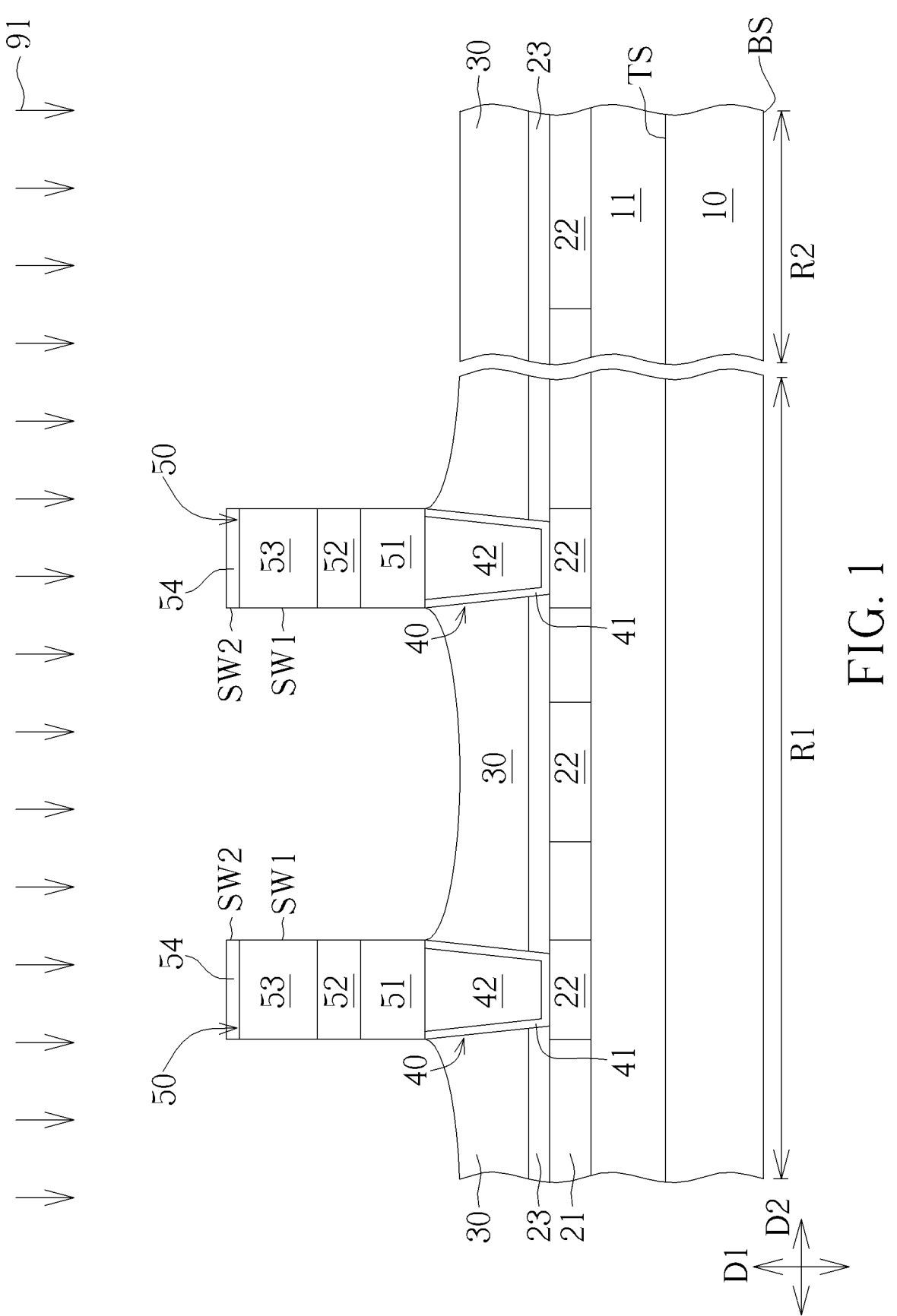
Figure 2:
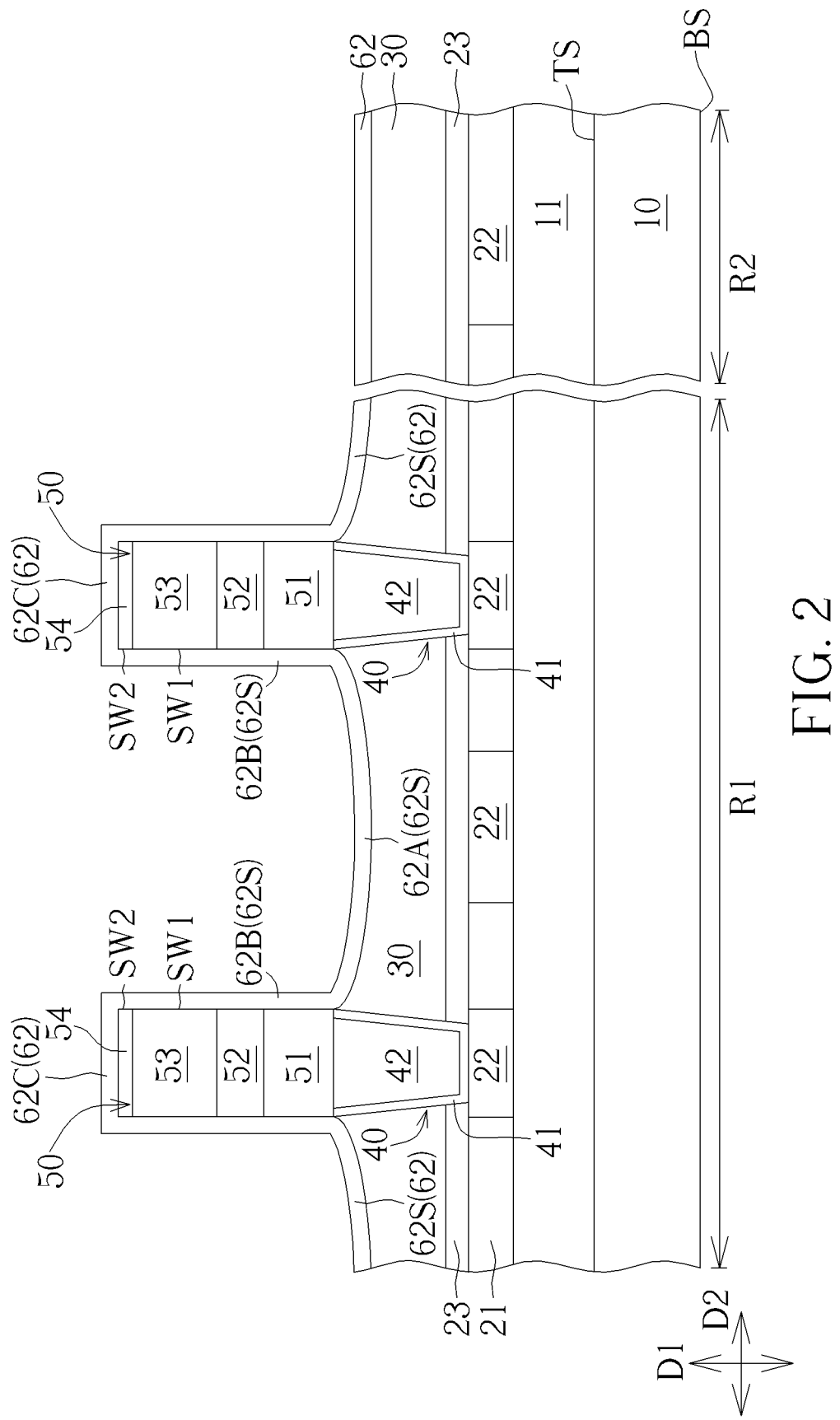
Figure 3:
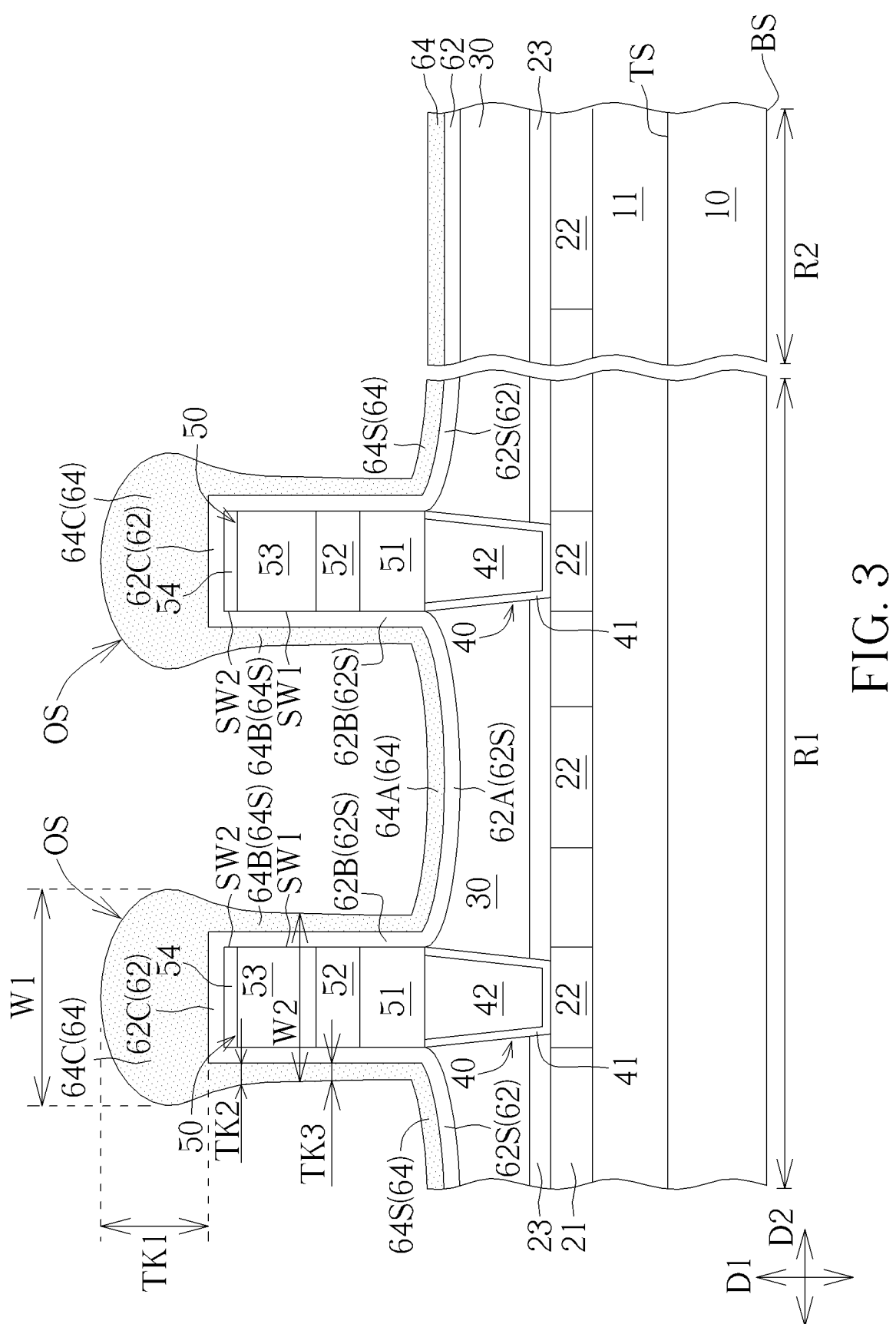
Figure 4:
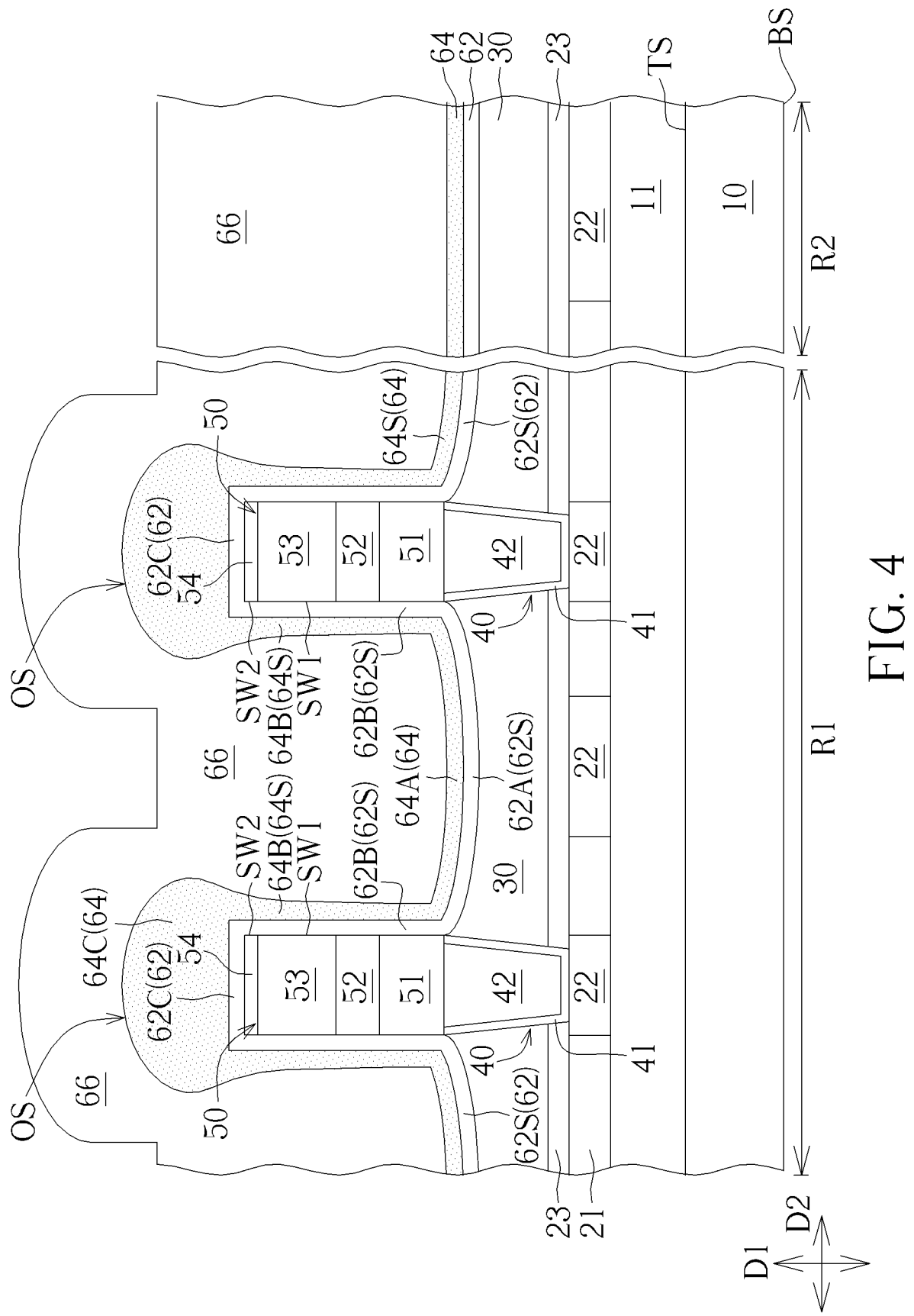
Figure 5:
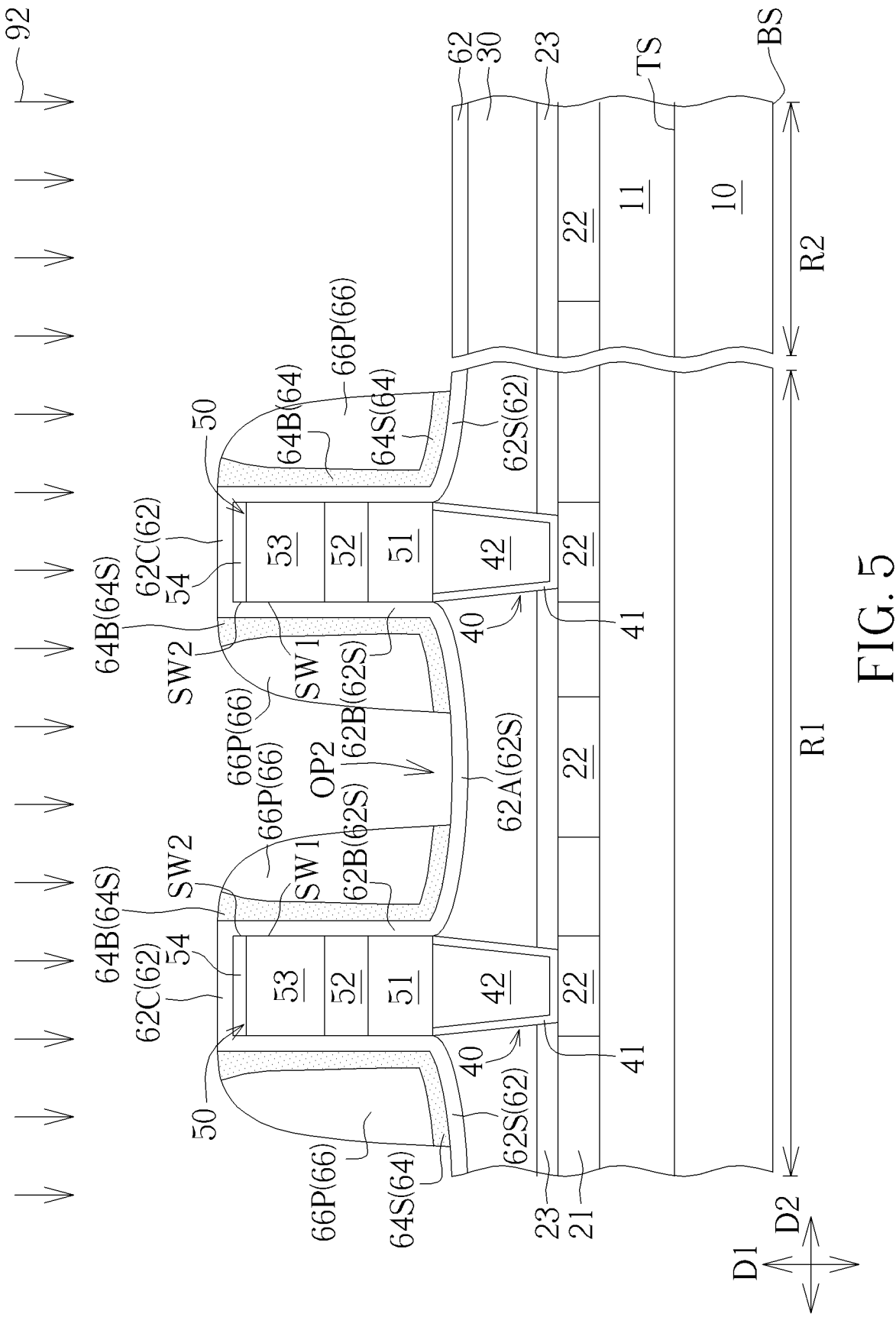
Figure 6:
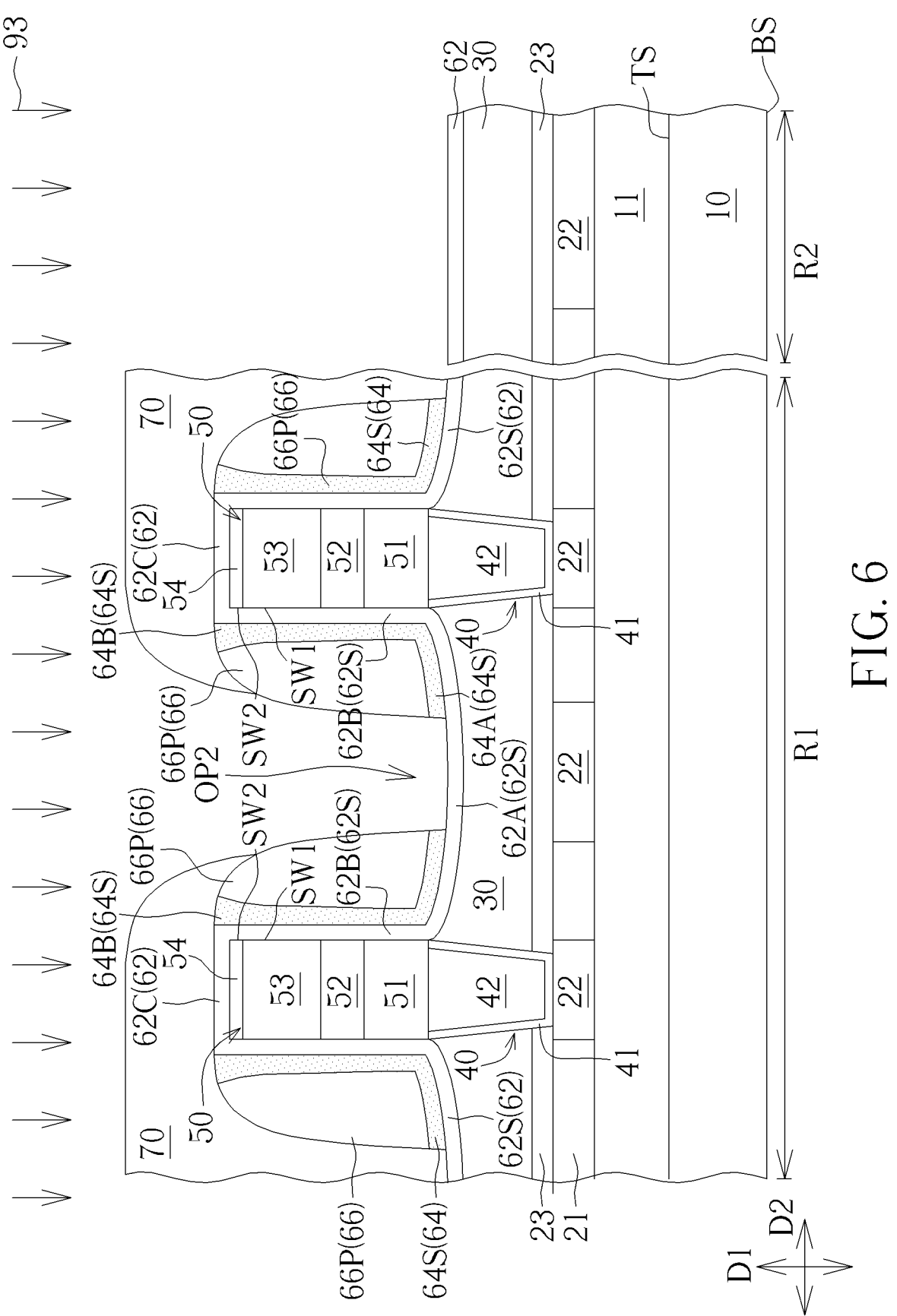
Figure 7:
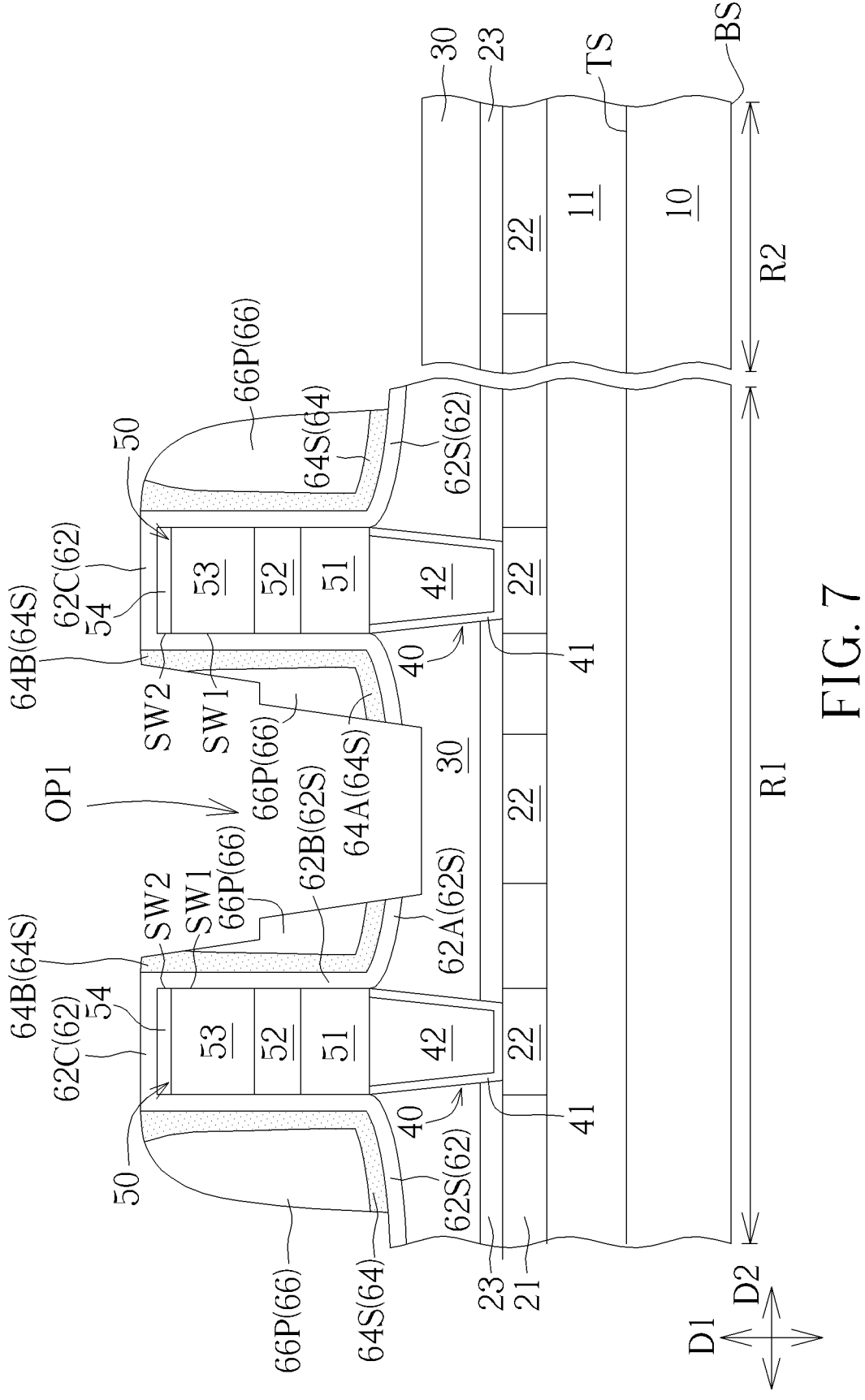
Figure 8:
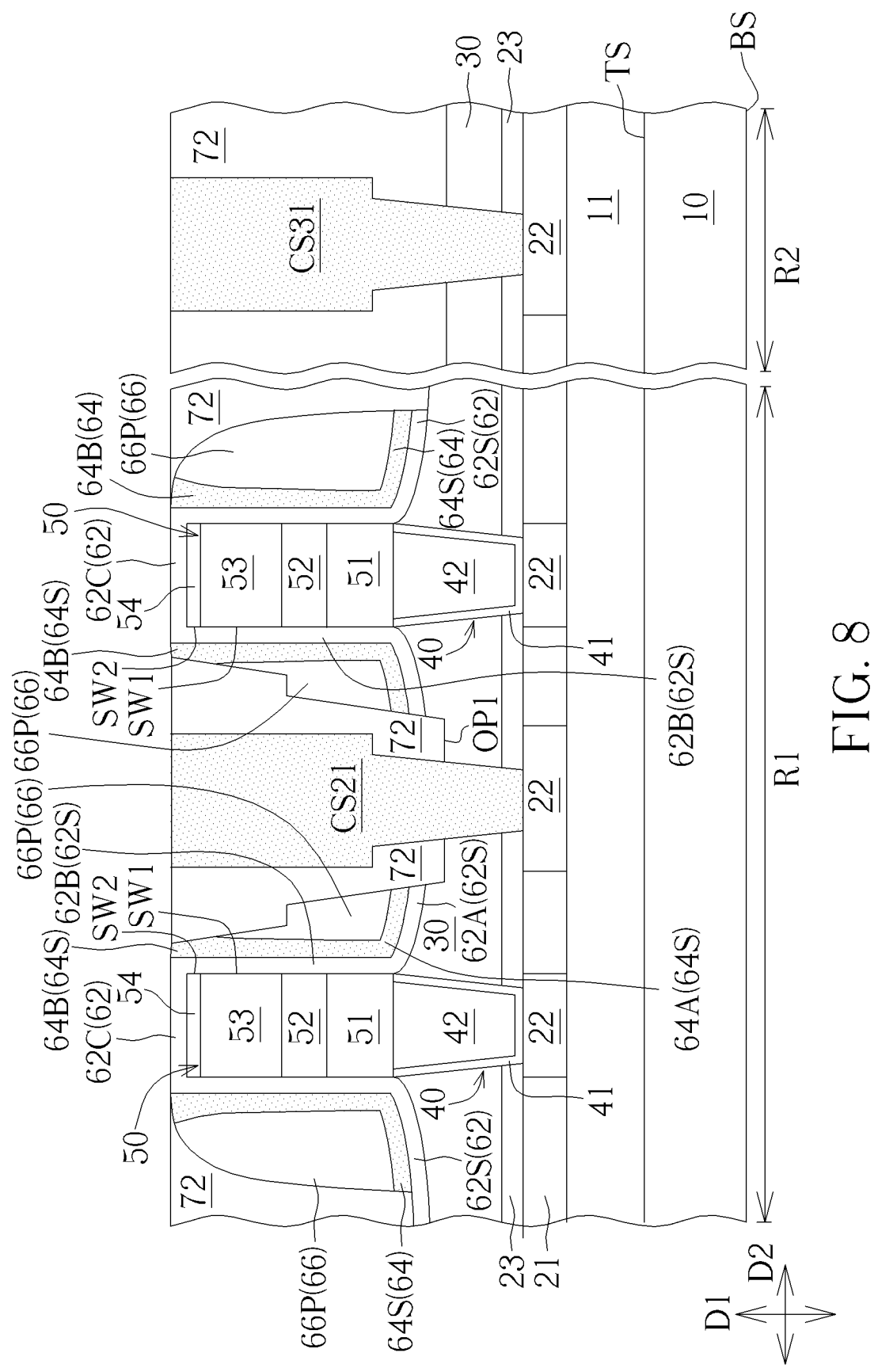
Figure 9:
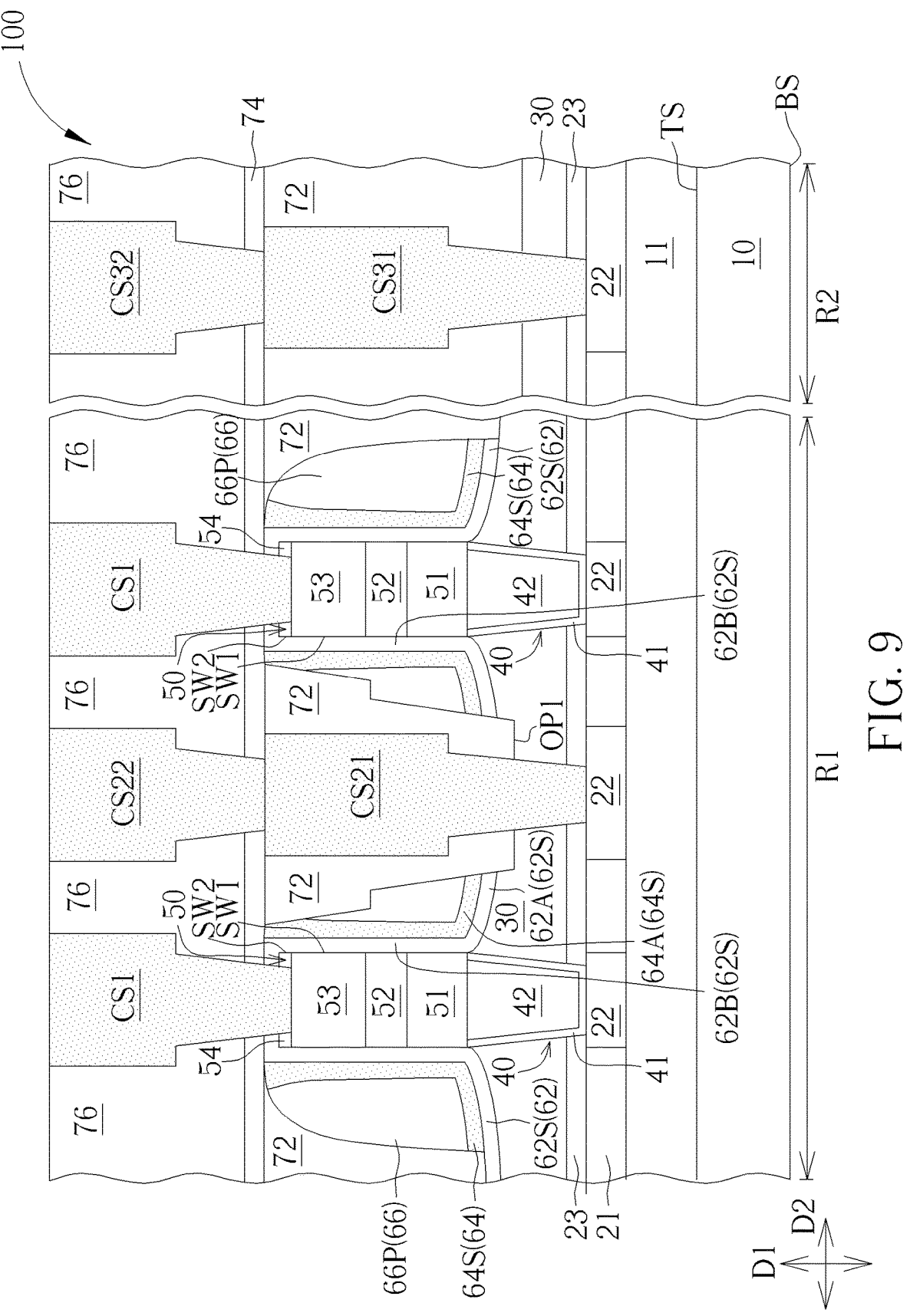

Please refer to FIGS. 1-9. FIGS. 1-9 are schematic drawings illustrating a manufacturing method of a memory device according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8. As shown in FIG. 9, a manufacturing method of a memory device 100 in this embodiment may include the following steps. A plurality of memory units 50 are formed on a substrate 10, and each of the memory units 50 includes a first electrode 51, a second electrode 53, and a memory material layer 52. The second electrode 53 is disposed above the first electrode 51 in a vertical direction (such as a first direction shown in FIG. 9), and the memory material layer 52 is disposed between the first electrode 51 and the second electrode 53 in the vertical direction. A conformal spacer layer (such as a first spacer layer 62 shown in FIG. 9) is formed on the memory units, and a non-conformal spacer layer (such as a second spacer layer 64 shown in FIG. 9) is formed on the conformal spacer layer. A first opening OP1 is formed subsequently. The first opening OP1 penetrates through a sidewall portion of the non-conformal spacer layer (such as a sidewall portion 64S of the second spacer layer 64) and a sidewall portion of the conformal spacer layer (such as a sidewall portion 62S of the first spacer layer 62) in the vertical direction. The spacer material on the sidewall of the memory unit 50 during the step of forming the first opening OP1 between the memory units 50 may be increased by forming the non-conformal second spacer layer 64 on the conformal first spacer layer 62, the performance of protecting the memory units 50 may be enhanced, and the manufacturing yield of the memory device may be improved accordingly.

In some embodiments, the substrate 10 may have a top surface TS and a bottom surface BS opposite to the top surface TS in a thickness direction of the substrate 10 (such as the first direction D1 shown in FIG. 1), and the memory unit 50, the first spacer layer 62, the second spacer layer 64, and the first opening OP1 described above may be disposed at a side of the top surface TS, but not limited thereto. A horizontal direction substantially orthogonal to the first direction D1 (such as a second direction D2 shown in FIG. 9) may be substantially parallel with the top surface TS and/or the bottom surface BS of the substrate 10, but not limited thereto. Additionally, in this description, a distance between the bottom surface BS of the substrate 10 and a relatively higher location and/or a relatively higher part in the vertical direction (such as the first direction D1) may be greater than a distance between the bottom surface BS of the substrate 10 and a relatively lower location and/or a relatively lower part in the first direction D1. The bottom or a lower portion of each component may be closer to the bottom surface BS of the substrate 10 in the first direction D1 than the top or upper portion of this component. Another component disposed above a specific component may be regarded as being relatively far from the bottom surface BS of the substrate 10 in the first direction D1, and another component disposed under a specific component may be regarded as being relatively closer to the bottom surface BS of the substrate 10 in the first direction D1, but not limited thereto.

Specifically, the manufacturing method of the memory device 100 in this embodiment may include but is not limited to the following steps. Firstly, as shown in FIG. 1, the memory units may be formed on the substrate 10. In some embodiments, the first electrode 51 and the second electrode 53 may include metallic materials, such as titanium (Ti), tantalum (Ta), platinum (Pt), ruthenium (Ru), a stack layer of the above-mentioned materials, an alloy of the above-mentioned materials, a mixture of the material described above, or other suitable metallic electrically conductive materials or non-metallic electrically conductive materials. The memory material layer 52 in each of the memory units 50 may include a magnetic tunnel junction (MTJ) structure or other suitable material layers capable of providing memory operations by changing state. In some embodiments, the magnetic tunnel junction structure described above may include a pinned layer, a first barrier layer, a free layer, and a second barrier layer disposed sequentially and stacked in the first direction D1, but not limited thereto. In some embodiments, the pinned layer may include an antiferromagnetic layer and a reference layer. The antiferromagnetic layer may include antiferromagnetic materials such as iron manganese (FeMn), platinum manganese (PtMn), iridium manganese (IrMn), nickel oxide (NiO), a cobalt/platinum (Co/Pt) multilayer, or other suitable antiferromagnetic materials. The free layer and the reference layer in the pinned layer may include ferromagnetic materials such as iron, cobalt, nickel, cobalt-iron (CoFe), cobalt-iron-boron (CoFeB), or other suitable ferromagnetic materials. The first barrier layer and the second barrier layer may include insulation materials such as magnesium oxide (MgO), aluminum oxide, or other suitable insulation materials. In some embodiments, the material layer for forming the first electrode 51, the material layers in the magnetic tunnel junction, and the material layer for forming the second electrode 53 may be formed sequentially and stacked by deposition processes, such as sputtering processes, and a cap layer 54 may be formed on the stacked material layers. Subsequently, the memory units 50 may be formed by performing an etching process 91 using the cap layer 54 and/or a patterned photoresist layer (not illustrated) as an etching mask to the stacked material layers, and the cap layer 54 may be located on each of the memory units 50 after the etching process 91.

In some embodiments, the cap layer 54 may include an oxide insulation material or other suitable insulation materials, and the etching process 91 may include a reactive ion etching RIE) process or other suitable etching approaches. The substrate 10 may include a semiconductor substrate or a non-semiconductor substrate. The semiconductor substrate may include a silicon substrate, a silicon germanium semiconductor substrate, or a silicon-on-insulator (SOI) substrate, and the non-semiconductor substrate may include a glass substrate, a plastic substrate, or a ceramic substrate, but not limited thereto. For example, when the substrate 10 includes a semiconductor substrate, a plurality of silicon-based field effect transistors (not illustrated), a dielectric layer (such as a dielectric layer 11 and a dielectric layer 21 shown in FIG. 1) covering the silicon-based field effect transistors, metal interconnections 22, a stop layer 23, an inter-metal dielectric layer 30, and metal interconnections 40 may be formed on the semiconductor substrate before the step of forming the stacked material layer described above and the etching process configured for forming the memory units 50 according to some design considerations. Each of the memory units 50 may be formed on and electrically connected with the corresponding metal interconnection 40.

In some embodiments, the metal interconnections 40 may be electrically connected with some of the metal interconnections 22, respectively, and the metal interconnections 40 may be electrically connected downward to the silicon-based field effect transistor described above via some of the metal interconnections 22, but not limited thereto. In some embodiments, each of the metal interconnections 22 may be regarded as a trench conductor mainly elongated in a horizontal direction (such as another horizontal direction perpendicular to the second direction D2), and each of the metal interconnections 40 may be regarded as a via conductor mainly elongated in the vertical direction (such as the first direction D1), but not limited thereto. In some embodiments, each of the metal interconnections 40 may include a barrier layer 41 and a metal layer 42. The barrier layer 41 may include titanium (Ti), titanium nitride (TiN), tantalum (Ta), tantalum nitride (TaN) or other suitable barrier materials, and the metal layer 42 may include tungsten (W), copper (Cu), aluminum (Al), titanium aluminide (TiAl), cobalt tungsten phosphide (CoWP), or other suitable metallic materials. Additionally, in some embodiments, the substrate 10 may include a first region R1 and a second region R2. The first region R1 may be regarded as a memory cell region with the memory units 50 disposed thereon, and the second region R2 may be regarded as a logic region, but not limited thereto. The dielectric layer 11, the dielectric layer 21, the metal interconnections 22, the stop layer 23, and the inter-metal dielectric layer 30 described above may be partly formed on the second region R2 also. In some embodiments, the region located between the memory units 50 adjacent to each other may be regarded as a region corresponding to word lines, and the metal interconnection 22 disposed in this region may include a word line or be electrically connected with a word line, but not limited thereto. The dielectric layer 11, the dielectric layer 21, and the inter-metal dielectric layer 30 may respectively include silicon oxide, a low-k dielectric material, or other suitable dielectric materials. The stop layer

23 may include nitrogen doped carbide (NDC), silicon nitride, silicon carbon-nitride (SiCN), or other suitable insulation materials.

Subsequently, as shown in FIG. 2, the first spacer layer 62 is conformally formed on the cap layer 54, the memory units 50, and the inter-metal dielectric layer 30. A thickness of the first spacer layer 62 formed on the sidewall of the memory unit 50, a thickness of the first spacer layer 62 formed on the cap layer 54, and a thickness of the first spacer layer 62 formed on the inter-metal dielectric layer 30 may be substantially equal to one another, and the first spacer layer 62 may be regarded as a conformal spacer layer accordingly. In some embodiments, the first spacer layer 62 may include a first portion 62A, a second portion 62B, and a third portion 62C. The first portion 62A may be formed between the memory units 50 adjacent to each other in the horizontal direction (such as the second direction D2), and the first portion 62A may be disposed on the inter-metal dielectric layer 30 in the first direction D1. The second portion 62B may be formed on a sidewall SW2 of the cap layer 54 on each of the memory units 50 and a sidewall of each of the memory units 50, such as a sidewall of the first electrode 51, a sidewall of the memory material layer 52, and a sidewall SW1 of the second electrode 53. The third portion 62C may be formed on the memory units 50 and the cap layer 54 in the first direction D1. The first portion 62A may be directly connected with the second portion 62B, and the second portion 62B may be directly connected with the third portion 62C. The first portion 62A and the second portion 62B may be regarded as the sidewall portion 62S of the first spacer layer 62.

In some embodiments, the thickness of the first portion 62A of the first spacer layer 62, the thickness of the second portion 62B of the first spacer layer 62, and the thickness of the third portion 62C of the first spacer layer 62 may be substantially equal to one another. The thickness of the first portion 62A may be defined as a distance between a surface of the first portion 62A contacting the inter-metal dielectric layer 30 and a top surface of the first portion 62A in the first direction D1, the thickness of the second portion 62B may be defined as a distance between a surface of the second portion 62B contacting the memory unit 50 and a surface of the second portion 62B away from the memory unit 50 in the horizontal direction (such as the second direction D2), and the thickness of the third portion 62C may be defined as a distance between a surface of the third portion 62C contacting the cap layer 54 and a top surface of the third portion 62C in the first direction D1, but not limited thereto.

Subsequently, as shown in FIG. 3, the second spacer layer 64 is formed on the first spacer layer 62. The second spacer layer 64 may have a plurality of overhang structures OS, each of the overhang structures OS may be formed above one of the memory units 50, and the second spacer layer 64 may be regarded as a non-conformal spacer layer accordingly. In other words, the cap layer 54 on each of the memory units 50 may be formed on the substrate 10 before the step of forming the first spacer layer 62 and the step of forming the second spacer layer 64. In some embodiments, the second spacer layer 64 may include a first portion 64A, a second portion 64B, and a third portion 64C. The first portion 64A may be formed on the first portion 62A of the first spacer layer 62, the second portion 64B may be formed on the second portion 62B of the first spacer layer 62 in the horizontal direction (such as the second direction D2), and the third portion 64C may be formed on the third portion 62C of the first spacer layer 62 in the first direction D1. The first portion 64A may be directly connected with the second portion 64B, and the second portion 64B may be directly connected with the third portion 64C. The first portion 64A and the second portion 64B may be regarded as the sidewall portion 64S of the second spacer layer 64. The third portion 64C of the second spacer layer 64 and a part of the second portion 64B of the second spacer layer 64 on each of the memory units 50 may form and/or constitute the overhang structure OS.

In some embodiments, a width W1 of the third portion 64C of the second spacer layer 64 on each of the memory units 50 may be greater than a width W2 of the second portion 64B of the second spacer layer 64 on each of the memory units 50, and a thickness TK1 of the third portion 64C of the second spacer layer 64 on each of the memory units 50 may be greater than a thickness of the second portion 64B of the second spacer layer 64 on each of the memory units 50 (such as a thickness TK2 and/or a thickness TK3 shown in FIG. 3) for forming the overhang structures OS. For example, the width W1 described above may be regarded as a length of the third portion 64C of the second spacer layer 64 on one of the memory units 50 in the second direction D2, and the width W2 described above may be regarded as a distance between two outer surfaces of the second portion 64B formed at two opposite sides of one of the memory units 50 in the second direction D2, but not limited thereto. Additionally, in some embodiments, the second portion 64B of the second spacer layer 64 may be formed on the second electrode 53, the memory material layer 52, and the first electrode 51 of each of the memory units 50 in the horizontal direction (such as the second direction D2). The thickness TK2 of the second spacer layer 64 on each of the second electrodes 53 in the second direction D2 may be greater than the thickness TK3 of the second spacer layer 64 on each of the memory material layers 52 in the second direction D2, and at least a part of the second spacer layer 64 on each of the second electrodes 53 may be used to form the overhang structures OS accordingly.

In some embodiments, the thickness TK1 may be regarded as a length of the third portion 64C of the second spacer layer 64 on each of the memory units 50 in the first direction D1, the thickness TK2 may be regarded as a distance between a surface of the second portion 64B disposed on the second electrode 53 in the second direction D2 and contacting the first spacer layer 62 and a surface of the second portion 64B away from the memory unit 50 in the second direction D2, and the thickness TK3 may be regarded as a distance between a surface of the second portion 64B disposed on the memory material layer 52 in the second direction D2 and contacting the first spacer layer 62 and a surface of the second portion 64B away from the memory unit 50 in the second direction D2, but not limited thereto. In some embodiments, the second spacer layer 64 including the overhang structures OS may be formed by modifying process conditions (such as a direction and/or an angle of deposition) of the film forming process of the second spacer layer 64 (such as a chemical vapor deposition, but not limited thereto). In addition, a material composition of the first spacer layer 62 may be different from a material composition of the second spacer layer 64, and a material composition of the cap layer 54 may be different from the material composition of the first spacer layer 62 for providing required etching selectivity in the subsequent processes. For example, the cap layer 54 may include an oxide insulation material, the first spacer layer 62 may include silicon nitride or other insulation materials different from the material of the cap layer 54, and the second spacer layer 64 may include oxide (such as silicon oxide), silicon carbide, or other insulation materials different from the material of the first spacer layer 62.

As shown in FIG. 4, a third spacer layer 66 may be formed on the second spacer layer 64. Therefore, a portion of the third spacer layer 66 may be formed on the memory units 50 in the first direction D1, and another portion of the third spacer layer 66 may be formed between the memory units 50 adjacent to each other in the second direction D2. A distance between protruding portions on the surface of the third spacer layer 66 may be reduced by the second spacer layer 64 having the overhang structures OS, and more spacer material may remain on the sidewall of the memory unit 50 for improving the effect of protecting the memory units 50 when a subsequent etching back process is performed to the third spacer layer 66 and the second spacer layer 64 so as to form a spacer structure accordingly. In some embodiments, the space between the memory units 50 adjacent to each other may be filled with a relatively small amount of the third spacer layer 66 because of the influence of the second spacer layer 64 including the overhang structures OS. Accordingly, the third spacer layer 66 on the memory unit 50 in the first direction D1 may be relatively thinner, the time of the etching back process performed to the third spacer layer 66 may be reduced relatively, and more spacer material may remain on the sidewall of the memory unit 50 after the etching back process. In some embodiments, the third spacer layer 66 may include an oxide material (such as oxide formed by an atomic layer deposition process) or other suitable insulation materials. The material composition of the third spacer layer 66 may be different from the material composition of the second spacer layer 64, or the material composition of the third spacer layer 66 may be similar to that of the second spacer layer 64 (such as silicon oxide) with different film forming approaches configured to form the third spacer layer 66 and the second spacer layer 64 respectively for providing the required etching selectivity in the subsequent processes still.

As shown in FIG. 4 and FIG. 5, an etching process 92 may be performed for etching the third spacer layer 66 and the second spacer layer 64 so as to form spacer structures 66P and a second opening OP2. The second opening OP2 may penetrate through the third spacer layer 66 and the first portion 64A of the second spacer layer 64 in the first direction D1 and expose the first portion 62A of the first spacer layer 62. In other words, the third spacer layer 66 may be formed before the step of forming the second opening OP2, the second opening OP2 does not penetrate the first portion 62A of the first spacer layer 62, and a remaining portion of the third spacer layer 66 after being etched by the etching process 92 may become the spacer structures 66P formed on the sidewall portion 64S of the second spacer layer 64. In some embodiments, the etching process 92 may be regarded as an etching back process performed to the third spacer layer 66 and the second spacer layer 64, and the second opening OP2 may be formed by this etching back process. In addition, the third portion 64C of the second spacer layer 64 may be removed by and/or removed during the step of forming the second opening OP2 (such as the etching process 92), and third spacer layer 66 and the second spacer layer 64 above the second region R2 may be removed by the etching process 92.

As shown in FIGS. 5-7, the first opening OP1 may be formed subsequently, and the first opening OP1 may penetrate through the third spacer layer 66, the sidewall portion 64S of the second spacer layer 64 (such as the first portion 64A), and the sidewall portion 62S of the first spacer layer 62 (such as the first portion 62A) in the first direction D1 and expose a part of the inter-metal dielectric layer 30. In other words, the second opening OP2 may be formed before the step of forming the first opening OP1, and the first opening OP1 may be formed by performing an etching process to the second opening OP2. For example, a patterned mask layer 70 may be formed covering the first spacer layer 62, the second spacer layer 64, and the third spacer layer 66 on the memory units 50 and exposing a part of the second opening OP2 and the first spacer layer 62 on the second region R2. An etching process 93 may be performed after the step of forming the patterned mask layer 70 so as to form the first opening OP1 and remove the first spacer layer 62 on the second region R2 for exposing the inter-metal dielectric layer 30 on the second region R2. In some embodiments, the patterned mask layer 70 may include a patterned photoresist layer, and the patterned mask layer 70 may be completely removed during the etching process 93 or after the etching process 93. By the manufacturing approach described above, more spacer material may remain on the sidewall of each of the memory units 50 after the step of forming the second opening OP2. Therefore, after the etching process 93 and the step of forming the first opening OP1, the sidewall SW1 of the second electrode 53 in each of the memory units 50 may be completely covered by the second portion 62B of the first spacer layer 62 in the horizontal direction (such as the second direction D2), and the second portion 62B of the first spacer layer 62 may be completely covered by the sidewall portion 64S of the second spacer layer 64 (such as the second portion 64B) in the horizontal direction (such as the second direction D2) for protecting the memory units 50. In addition, after the step of forming the first opening OP1, the sidewall portion 62S of the first spacer layer 62 may still cover the sidewall SW1 of the second electrode 53 in each of the memory units 50 and the sidewall SW2 of the cap layer 54 on each of the memory units 50, and the second electrode 53 may still be encompassed by the cap layer 54 and the first spacer layer 62 after the step of forming the first opening OP1 for being protected.

Subsequently, as shown in FIG. 8, a low dielectric constant dielectric layer 72, a connection structure CS21, and a connection structure CS31 may be formed. The low dielectric constant dielectric layer 72 may be formed in the first opening OP1, on the third spacer layer 66, on the inter-metal dielectric layer 30, and on the inter-metal dielectric layer 30 located above the second region R2. The connection structure CS21 may be formed between the memory units 50 adjacent to each other and penetrate through the stop layer 23, the inter-metal dielectric layer 30, and the low dielectric constant dielectric layer 72 located in the first opening OP1 in the first direction D1 for being electrically connected with the metal interconnection 22 located between the memory units 50 adjacent to each other. The connection structure CS31 may be formed on the second region R2 and penetrate through the stop layer 23, the inter-metal dielectric layer 30, and the low dielectric constant dielectric layer 72 in the first direction D1 for being electrically connected with the metal interconnection 22 on the second region R2. In some embodiments, a planarization process may be carried out after the step of forming the low dielectric constant dielectric layer 72 and before the step of forming the connection structure CS21 and the connection structure CS31 for making the top surface of the low dielectric constant dielectric layer 72, the top surface of the second spacer layer 64, and the top surface of the first spacer layer 62 substantially coplanar, but not limited thereto.

As shown in FIG. 9, after the step of forming the connection structure CS21 and the connection structure CS31, a stop layer 74, a low dielectric constant dielectric layer 76, connection structures CS1, a connection structure CS22, and a connection structure CS32 may be formed for forming the memory device 100. The stop layer 74 may be formed on the low dielectric constant dielectric layer 72, the second spacer layer 64, the first spacer layer 62, the connection structure CS21, and the connection structure CS31, and the low dielectric constant dielectric layer 76 may be formed on the stop layer 74. Each of the connection structure CS1 may penetrate through the low dielectric constant dielectric layer 76, the stop layer 74, the first spacer layer 62, and the cap layer 54 on the memory unit 50 in the first direction D1 for contacting and being electrically connected with the second electrode 53. The connection structure CS22 may penetrate through the low dielectric constant dielectric layer 76 and the stop layer 74 on the connection structure CS21 in the first direction D1 for contacting and being electrically connected with the connection structure CS21. The connection structure CS32 may penetrate through the low dielectric constant dielectric layer 76 and the stop layer 74 on the connection structure CS31 in the first direction D1 for contacting and being electrically connected with the connection structure CS31. In some embodiments, each of the connection structures described above (such as the connection structure CS1, the connection structure CS21, the connection structure CS22, the connection structure CS31, and/or the connection structure CS32) may respectively include a via conductor and a trench conductor disposed on and connected with the via conductor. Each of the connection structures may be similar to the metal interconnection 40 by including a barrier layer (not illustrated) and a metal layer (not illustrated) respectively, but not limited thereto. In some embodiments, the low dielectric constant dielectric layer 72 and the low dielectric constant dielectric layer 76 may respectively include a dielectric material with a dielectric constant lower than 2.7, such as benzocyciclobutene (BCB), hydrogen silsesquioxane (HSQ), methyl silsesquioxane (MSQ), hydrogenated silicon oxycarbide (SiOC—H), a porous dielectric material, or other suitable dielectric materials. The stop layer 74 may respectively include nitrogen doped carbide, silicon nitride, silicon carbon-nitride, or other suitable insulation materials.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 10:
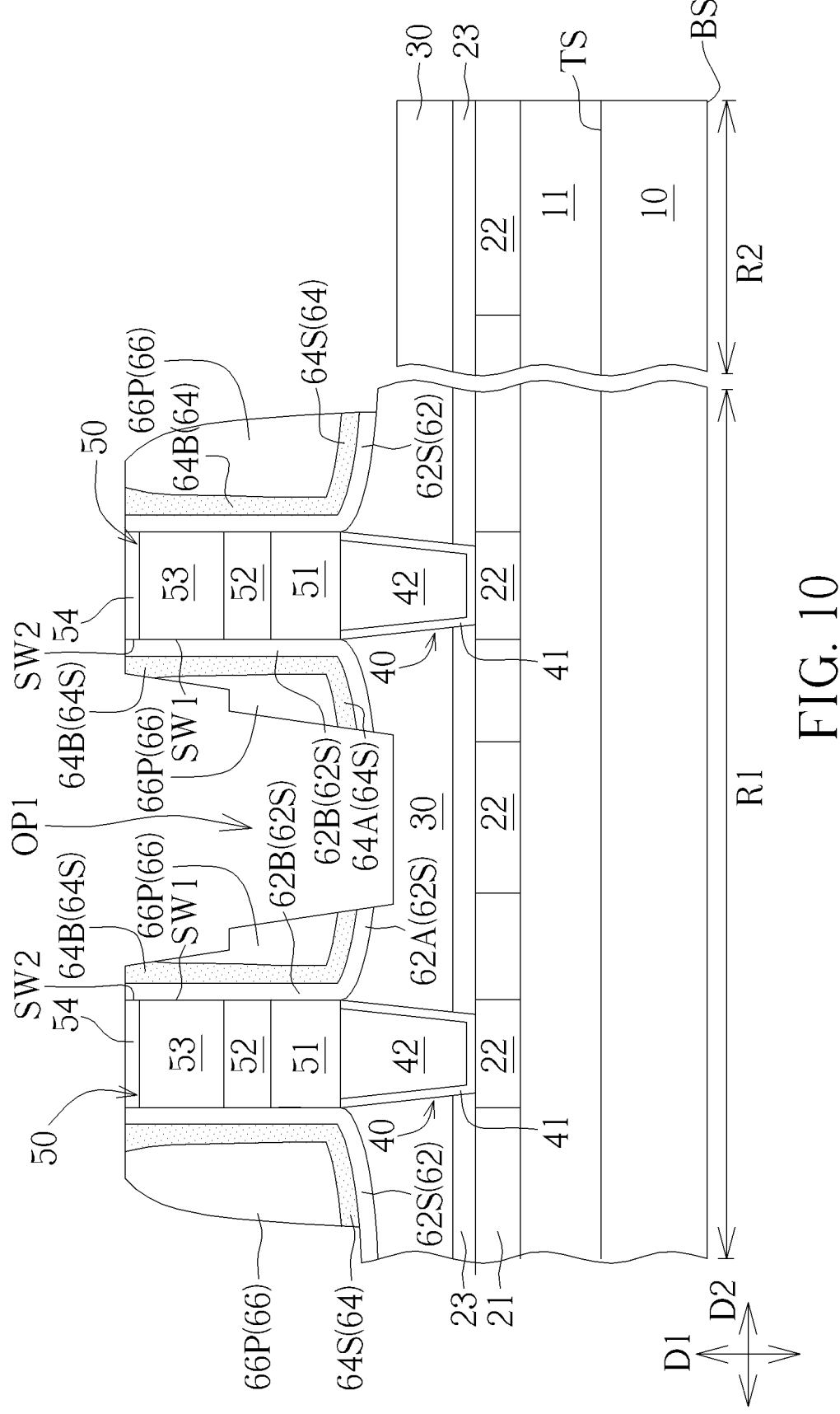
FIG. 10 is a schematic drawing illustrating a manufacturing method of a memory device according to another embodiment of the present invention.

Please refer to FIG. 10 and FIG. 6. FIG. 10 is a schematic drawing illustrating a manufacturing method of a memory device according to another embodiment of the present invention, and FIG. 10 may be regarded as a schematic drawing in a step subsequent to FIG. 6. As shown in FIG. 6 and FIG. 10, in some embodiments, the third portion 62C of the first spacer layer 62 may be removed by and/or removed during the step of forming the first opening OP1 (such as the etching process 93), but the second electrode 53 in each of the memory units 50 may still be covered by the cap layer 54 and the sidewall portion 62S of the first spacer layer 62 after the etching process 93 for being protected, and the second portion 62B of the first spacer layer 62 may still be covered by the second portion 64B of the second spacer layer 64 in the horizontal direction (such as the second direction D2) after the etching process 93 for being protected.

To summarize the above descriptions, in the manufacturing method of the memory device according to the present invention, the conformal spacer layer is formed on the memory unit and the non-conformal spacer layer is formed on the conformal spacer layer. More spacer materials may remain on the sidewall of each memory unit after the step of forming the first opening by the non-conformal spacer layer including the overhang structures. The performance of protecting the memory units may be enhanced, and the manufacturing yield of the memory device may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a memory device, comprising:

forming memory units on a substrate, wherein each of the memory units comprises:

a first electrode;

a second electrode disposed above the first electrode in a vertical direction; and a memory material layer disposed between the first electrode and the second electrode in the vertical direction;

forming a conformal spacer layer on the memory units, wherein the conformal spacer layer comprises:

a first portion located between the memory units adjacent to each other in a horizontal direction;

a second portion located on a sidewall of the second electrode of each of the memory units; and a third portion located above the memory units in the vertical direction;

forming a non-conformal spacer layer on the conformal spacer layer, wherein the non-conformal spacer layer comprises:

a first portion located on the first portion of the conformal spacer layer;

a second portion located on the second portion of the conformal spacer layer in the horizontal direction; and a third portion located above the third portion of the conformal spacer layer in the vertical direction;

forming a spacer layer on the non-conformal spacer layer;

forming a first opening penetrating through the spacer layer, the first portion of the non-conformal spacer layer and the first portion of the conformal spacer layer in the vertical direction, wherein the second portion of the non-conformal spacer layer is formed on the second electrode of each of the memory units and the memory material layer of each of the memory units in the horizontal direction, and a thickness of the second portion of the non-conformal spacer layer on each of the second electrodes in the horizontal direction is greater than a thickness of the second portion of the non-conformal spacer layer on each of the memory material layers in the horizontal direction, wherein the first opening is directly connected with the first portion of the non-conformal spacer layer and the first portion of the conformal spacer layer, a part of the spacer layer is located directly under a part of the non-conformal spacer layer in the vertical direction before the first opening is formed, and the part of the spacer layer is located directly above the first portion of the non-conformal spacer layer in the vertical direction before the first opening is formed; and forming a second opening penetrating through the spacer layer and the first portion of the non-conformal spacer layer in the vertical direction and exposing the first portion of the conformal spacer layer before the first opening is formed, wherein the second opening is formed by an etching back process performed to the spacer layer and the non-conformal spacer layer, and third portion of the conformal spacer layer is exposed by the etching back process before the first opening is formed.

2. The manufacturing method of the memory device according to claim 1, wherein the second portion of the conformal spacer layer is covered by the second portion of the non-conformal spacer layer in the horizontal direction after the first opening is formed.

3. The manufacturing method of the memory device according to claim 1, wherein the sidewall of the second electrode of each of the memory units is completely covered by the second portion of the conformal spacer layer in the horizontal direction after the first opening is formed, and the second portion of the conformal spacer layer is completely covered by the second portion of the non-conformal spacer layer in the horizontal direction after the first opening is formed.

4. The manufacturing method of the memory device according to claim 1, wherein the third portion of the non-conformal spacer layer and a part of the second portion of the non-conformal spacer layer on each of the memory units form an overhang structure.

5. The manufacturing method of the memory device according to claim 4, wherein a width of the third portion of the non-conformal spacer layer on each of the memory units is greater than a width of the second portion of the non-conformal spacer layer on each of the memory units.

6. The manufacturing method of the memory device according to claim 4, wherein a thickness of the third portion of the non-conformal spacer layer on each of the memory units is greater than the thickness of the second portion of the non-conformal spacer layer on each of the second electrodes in the horizontal direction and the thickness of the second portion of the non-conformal spacer layer on each of the memory material layers in the horizontal direction.

7. The manufacturing method of the memory device according to claim 4, wherein the third portion of the conformal spacer layer is removed by the step of forming the first opening.

8. The manufacturing method of the memory device according to claim 1, wherein the third portion of the non-conformal spacer layer is removed by the step of forming the second opening.

9. The manufacturing method of the memory device according to claim 1, wherein a material composition of the spacer layer is different from a material composition of the non-conformal spacer layer.

10. The manufacturing method of the memory device according to claim 1, wherein a material composition of the conformal spacer layer is different from a material composition of the non-conformal spacer layer.

11. The manufacturing method of the memory device according to claim 1, wherein the conformal spacer layer comprises silicon nitride, and the non-conformal spacer layer comprises oxide or silicon carbide.

12. The manufacturing method of the memory device according to claim 1, further comprising:

forming a cap layer on the substrate before the conformal spacer layer is formed, wherein the cap layer is located on each of the memory units, and the second portion of the conformal spacer layer covers the sidewall of the second electrode of each of the memory units and a sidewall of the cap layer on each of the memory units after the first opening is formed.

13. The manufacturing method of the memory device according to claim 12, wherein a material composition of the cap layer is different from a material composition of the conformal spacer layer.

14. The manufacturing method of the memory device according to claim 1, wherein the memory material layer in each of the memory units comprises a magnetic tunnel junction structure.

\* \* \* \* \*